(12) United States Patent
Jang et al.

(10) Patent No.: US 8,039,753 B2
(45) Date of Patent: Oct. 18, 2011

(54) FLEXIBLE PRINTED CIRCUIT BOARD

(75) Inventors: Jin-seok Jang, Suwon-si (KR); Jae-mo Chung, Suwon-si (KR); Jin-hee Sung, Suwon-si (KR); So-bo Chung, Suwon-si (KR); Jeong-su Kim, Suwon-si (KR); Dong-ho Lee, Suwon-si (KR); Tae-soo Kim, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 971 days.

(21) Appl. No.: 11/819,021

(22) Filed: Jun. 25, 2007

(65) Prior Publication Data

US 2008/0074853 A1 Mar. 27, 2008

(30) Foreign Application Priority Data

Sep. 22, 2006 (KR) .................. 10-2006-0092496

(51) Int. Cl.
*H05K 9/00* (2006.01)

(52) U.S. Cl. ........ 174/254; 361/749; 361/779; 362/631; 345/88; 345/173; 349/58; 349/61; 349/110; 349/122; 349/149; 349/150; 349/151

(58) Field of Classification Search .................. 174/254; 361/749, 779; 362/631; 345/88, 173; 349/58, 349/61, 110, 122, 149–151
See application file for complete search history.

(56) References Cited

U.S. PATENT DOCUMENTS

| 4,265,549 A | | 5/1981 | Cote | |
|---|---|---|---|---|
| 5,668,700 A | * | 9/1997 | Tagusa et al. | 361/779 |
| 5,777,610 A | * | 7/1998 | Sugimoto et al. | 345/206 |
| 6,433,414 B2 | | 8/2002 | Saito | |
| 6,897,912 B2 | * | 5/2005 | Kawakami et al. | 349/61 |
| 7,161,650 B2 | | 1/2007 | Hirano | |
| 7,184,117 B2 | * | 2/2007 | Suzuki | 349/150 |
| 7,319,498 B2 | | 1/2008 | Sakurai et al. | |
| 7,557,451 B2 | | 7/2009 | Shinojima | |
| 7,593,087 B2 | * | 9/2009 | Jang | 349/150 |
| 7,737,913 B2 | * | 6/2010 | Jang | 345/1.1 |
| 2002/0054261 A1 | * | 5/2002 | Sekiguchi | 349/122 |
| 2002/0135726 A1 | * | 9/2002 | Sakaki et al. | 349/149 |
| 2004/0041796 A1 | * | 3/2004 | Lee | 345/173 |
| 2004/0263759 A1 | * | 12/2004 | Matsuhira et al. | 349/151 |
| 2005/0088830 A1 | * | 4/2005 | Yumoto et al. | 361/749 |
| 2005/0190333 A1 | | 9/2005 | Wu et al. | |
| 2005/0213924 A1 | * | 9/2005 | Sakurai et al. | 385/147 |
| 2006/0114694 A1 | * | 6/2006 | Cho et al. | 362/631 |
| 2006/0119760 A1 | * | 6/2006 | Okuda | 349/58 |

(Continued)

FOREIGN PATENT DOCUMENTS

CN 1499245 A 5/2004

(Continued)

*Primary Examiner* — Xiaoliang Chen (74) *Attorney, Agent, or Firm* — Lee & Morse, P.C.

(57) ABSTRACT

A flexible printed circuit board includes a first substrate portion having at least one first terminal, a second substrate portion in communication with the first substrate portion and having at least one circuit device, a connection substrate portion in communication with the second substrate portion, the connection substrate portion extending away from the second substrate portion in a same direction as the first substrate portion, and a third substrate portion in communication with the connection substrate portion, the third substrate portion having at least one second terminal.

18 Claims, 6 Drawing Sheets

U.S. PATENT DOCUMENTS

| | | | | | |
|---|---|---|---|---|---|
| 2006/0119761 | A1* | 6/2006 | Okuda | ............................ | 349/58 |
| 2006/0125981 | A1* | 6/2006 | Okuda | ......................... | 349/110 |
| 2006/0133018 | A1* | 6/2006 | Okuda | ........................ | 361/681 |
| 2006/0139271 | A1* | 6/2006 | Okuda | ............................ | 345/88 |
| 2006/0250563 | A1* | 11/2006 | Nishita | ....................... | 349/150 |
| 2007/0023877 | A1* | 2/2007 | Yamazaki | .................... | 257/668 |

FOREIGN PATENT DOCUMENTS

| | | |
|---|---|---|
| JP | 04-023494 A | 1/1992 |
| JP | 05-082917 A | 4/1993 |
| JP | 10-049065 | 2/1998 |
| JP | 2000-250031 A | 9/2000 |
| JP | 2003-149672 A | 5/2003 |
| JP | 2004-258060 A | 9/2004 |
| JP | 2005-017483 A | 1/2005 |
| JP | 2005-115335 A | 4/2005 |
| JP | 2005-326454 A | 11/2005 |
| JP | 2006-133448 A | 5/2006 |
| KR | 1998-060564 | 11/1998 |
| KR | 10-2000-0009865 A | 2/2000 |
| KR | 10-2001-0078040 A | 8/2001 |
| KR | 10-2004-0058698 A | 7/2004 |
| KR | 10-2005-0064550 | 6/2005 |
| KR | 10-2006-0057951 | 5/2006 |

* cited by examiner

FLEXIBLE PRINTED CIRCUIT BOARD

BACKGROUND OF THE INVENTION

1. Field of the Invention

The present invention relates to a flexible printed circuit board. More particularly, the present invention relates to a flexible printed circuit board capable of supplying simultaneous electric connection to a plurality of units, while providing support for driving components.

2. Description of the Related Art

In general, a flexible printed circuit board refers to a circuit board having flexibility and capable of bending in order to connect electrical equipment. The conventional flexible printed circuit board may be formed by laminating a conductive wiring layer, e.g., a thin copper film, in a predetermined pattern onto a base film, e.g., an insulating resin, and coating the conductive wiring layer with a protective film. The protective film may be applied so that portions of the conductive wiring layer may remain exposed, i.e., form terminals, to facilitate electric connection.

The conventional flexible printed circuit board may connect two vertically adjacent electric units, and may facilitate exchange of electrical signals therebetween. More specifically, the flexible printed circuit board may be positioned in a ⊃-form, i.e., a rotated U-shape, so that an upper end of the flexible printed circuit board may be connected to an upper unit and a lower end of the flexible printed circuit board may be connected to a lower unit, i.e., a unit positioned below the upper unit. However, a structure of a flexible printed circuit board capable of simultaneously connecting more than two units, e.g., three vertically adjacent units, may be complex and inefficient. Further, a structure of a flexible printed circuit board capable of connecting a plurality of units, while providing support for driving components corresponding to the plurality of units may be deficient and complicated.

Accordingly, there exists a need for a flexible printed circuit board capable of forming a simultaneous electrical connection between more than two units.

SUMMARY OF THE INVENTION

The present invention is therefore directed to a flexible printed circuit board, which substantially overcomes one or more of the disadvantages of the related art.

It is therefore a feature of the present invention to provide a flexible printed circuit board capable of providing a simultaneous electrical connection between more than two units.

At least one of the above and other features and advantages of the present invention may be realized by providing a flexible printed circuit board, including a first substrate portion having at least one first terminal, a second substrate portion in communication with the first substrate portion and having at least one circuit device, a connection substrate portion in communication with the second substrate portion, the connection substrate portion extending away from the second substrate portion in a same direction as the first substrate portion, and a third substrate portion in communication with the connection substrate portion, the third substrate portion having at least one second terminal.

A length of the first substrate portion may be shorter than a length of the connection substrate portion. Further, a width of the first substrate portion may be larger than a width of the connection substrate portion.

A thickness of the first substrate portion may be lower than a thickness of the second substrate portion, so that the first substrate portion may include one conductive wiring layer, and the second substrate portion may include a plurality of conductive wiring layers. Similarly, a thickness of the connection substrate portion may be lower than a thickness of the third substrate portion, so that the connection substrate portion may include one conductive wiring layer, and the third substrate portion may include a plurality of conductive wiring layers.

The connection substrate portion may be coupled between the second and third substrate portions. Alternatively, the connection substrate portion may include a first connection substrate portion coupled between a first end of the second substrate portion and a first end of the third substrate portion, and a second connection substrate portion coupled between a second end of the second substrate portion and a second end of the third substrate portion. The first end of the second substrate portion and the first end of the third substrate portion may be adjacent to one another along a direction parallel to the first connection substrate portion.

At least one of the above and other features and advantages of the present invention may be also realized by providing a display device, including a display panel, a backlight unit adjacent to the display panel, a printed circuit board, and a flexible printed circuit board including a first substrate portion in communication with the display panel and bent around an edge thereof, a second substrate portion in communication with the first substrate portion and positioned between the display panel and the backlight unit, a connection substrate portion in communication with the second substrate portion and bent around an edge of the backlight unit, and a third substrate portion in communication with the connection substrate portion and the printed circuit board.

A width of the first substrate portion may be greater than a width of the connection substrate portion. A length of the first substrate portion may be shorter than a length of the connection substrate portion. Further, a thickness of each of the first substrate portion and the connection substrate portion may be lower than a thickness of each of the second and third substrate portions, so that each of the first substrate portion and the connection substrate portion may include one conductive wiring layer, and each of the second and third substrate portions may include a plurality of conductive wiring layers.

The connection substrate portion may be coupled between the second and third substrate portions and bent away from the first substrate portion. Alternatively, the connection substrate portion may include first and second connection substrate portions, each of the first and second connection substrate portions may be coupled between the second and third substrate portions and positioned in parallel to one another.

The second substrate portion may include at least one light source. The at least one light source may be a light emitting diode.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Korean Patent Application No. 10-2006-0092496, filed on Sep. 22, 2006, in the Korean Intellectual Property Office, and entitled: "Flexible Printed Circuit Board," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers or elements may also be present. Further, it will be understood that when a layer or element is referred to as being "under" another layer or element, it can be directly under, or one or more intervening layers or elements may also be present. In addition, it will also be understood that when a layer or element is referred to as being "between" two layers or elements, it can be the only layer or element between the two layers or elements, or one or more intervening layers or elements may also be present. Like reference numerals refer to like elements throughout.

Figure 1A:
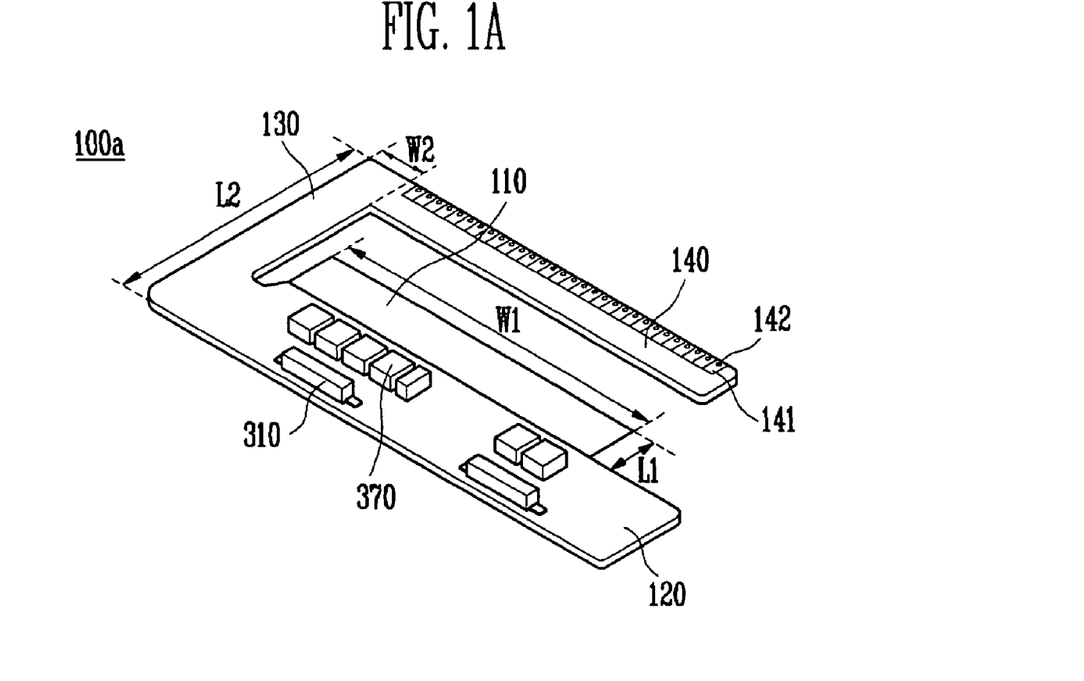
FIG. 1A illustrates a perspective view of a flexible printed circuit board according to an embodiment of the present invention.
Figure 1B:
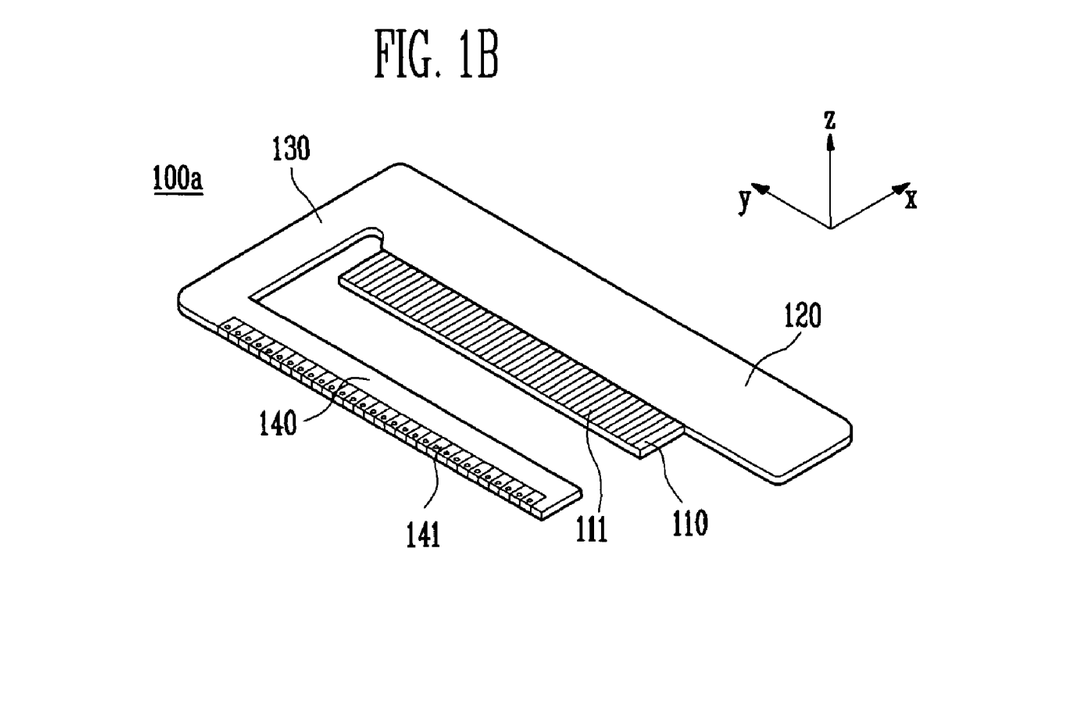
FIG. 1B illustrates a bottom perspective view of the flexible printed circuit board illustrated in FIG. 1A.

The flexible printed circuit board according to an embodiment of the present invention may include at least one conductive wiring layer having a plurality of conductive metallic wires, and an insulating protective layer coating the conductive wiring layer. An exemplary embodiment of a structure of a flexible printed circuit board according to the present invention will be described in a more detail below with reference to FIGS. 1A-1B. As illustrated in FIGS. 1A-1B, a flexible printed circuit board 100a may include a first substrate portion 110, a second substrate portion 120, a connection substrate portion 130, and a third substrate portion 140. The connection substrate portion 130 and the first, second and third substrate portions 110, 120 and 140 may be integrally connected.

The first substrate portion 110 of the flexible printed circuit board 100a according to an embodiment of the present invention may have a rectangular shape having a first width W1, i.e., a distance as measured along a y-axis, and a first length L1, a distance as measured along a x-axis, as illustrated in FIG. 1A. The first substrate portion 110 may be positioned in parallel to the second substrate portion 120, i.e., in an xy-plane, and connected thereto along the y-axis, i.e., so that portions of faces of the first and second substrate portions 110 and 120 may be in communication with one another in a yz-plane. The first substrate portion 110 may be, e.g., centered along the second substrate portion 120.

The first substrate portion 110 may include a single layer of the conductive wiring layer to impart flexibility thereto. In other words, the first substrate portion 110 may be formed to have a thickness, i.e., a distance as measured along a z-axis, that is lower as compared to thicknesses of the second and third substrate portions 120 and 140 of the flexible printed circuit board 100a in order to facilitate bending of the first substrate portion 110. The first substrate portion 110 may include at least one terminal 111, as illustrated in FIG. 1B, connected to an external unit (not shown). The terminal 111 of the first substrate portion 110 may be formed on a lower surface of the first substrate portion 110 by exposing a conductive wiring layer of the first substrate portion 110. Accordingly, bending of the first substrate portion 110 toward the external unit may facilitate electrical connection between the at least one terminal 111 of the first substrate portion 110 and the external unit.

The second substrate portion 120 of the flexible printed circuit board 100a according to an embodiment of the present invention may have a rectangular shape, as illustrated in FIG. 1A. The second substrate portion 120 may be positioned in the xy-plane, so that electrical components, i.e., driving components to which electrical signals are applied, may be mounted on an upper surface, i.e., in the xy-plane, thereof. A size of the second substrate portion 120 may be sufficient to include any number of electrical components or circuit devices as may be determined by one of ordinary skill in the art. For example, a circuit component mounted on the second substrate portion 120 may include at least one light emitting diode 310, a boosting circuit 370, and so forth. The second substrate portion 120 may include a plurality of conductive wiring layers. The number of conductive wiring layers employed in the second substrate portion 120 may be determined by one of ordinary skill in the art, so that flexibility and bending of the second substrate portion 120 may be minimized.

The connection substrate portion 130 of the flexible printed circuit board 100a according to an embodiment of the present invention may have a rectangular shape having a second width W2, i.e., a distance as measured along the y-axis, and a second length L2, a distance as measured along the x-axis, as illustrated in FIG. 1A. The connection substrate portion 130 may be positioned in a plane parallel to the second substrate portion 120, i.e., in the xy-plane, and connected thereto along the x-axis, i.e., so that portions of faces of the connection substrate portion 130 and the second substrate portion 120 may be in communication with one another in a xz-plane. The connection substrate portion 130 and the second substrate portion 120 may form a Γ-shape, i.e., the Greek capital letter gamma, in the xy-plane with respect to the x-axis, so that the connection substrate portion 130 may be adjacent to the first substrate portion 110 in the xy-plane. In other words, the first substrate portion 110 and the connection substrate portion 130 may extend away from the second substrate portion 120 in the same direction.

It should be noted, however, that the connection substrate portion 130 and the first substrate portion 110 may have a predetermined distance therebetween, i.e., as measured along the y-axis, so that the first substrate portion 110 and the connection substrate portion 130 may move independently from one another. In this respect, it should further be noted that the connection substrate portion 130 may include a single layer of the conductive wiring layer to impart flexibility thereto. In other words, the connection substrate portion 130 may be formed to have a lower thickness as compared to the second and third substrate portions 120 and 140 of the flexible printed circuit board 100a, i.e., portions of the flexible printed circuit board 100a that are not bent, to facilitate bending of the connection substrate portion 130.

The first width W1 of the first substrate portion 110 may be wider than the second width W2 of the connection substrate portion 130. The first length L1 of the first substrate portion 110 may be shorter than the second length L2 of the connection substrate portion 130.

The third substrate portion 140 of the flexible printed circuit board 100a according to an embodiment of the present invention may have a rectangular shape, and may be connected to the connection substrate portion 130. In other words, the connection substrate portion 130 may be positioned between the second and third substrate portions 120 and 140, as illustrated in FIGS. 1A-1B. The third substrate portion 140 may include a plurality of conductive wiring layers, so that flexibility and bending of the third substrate portion 140 may be minimized. Further, the third substrate portion 140 may include at least one terminal 141. The terminal 141 may include an exposed portion of the conductive wiring layer, so that a through-hole 142 may be formed therethrough to facilitate electrical connection.

Figure 1C:
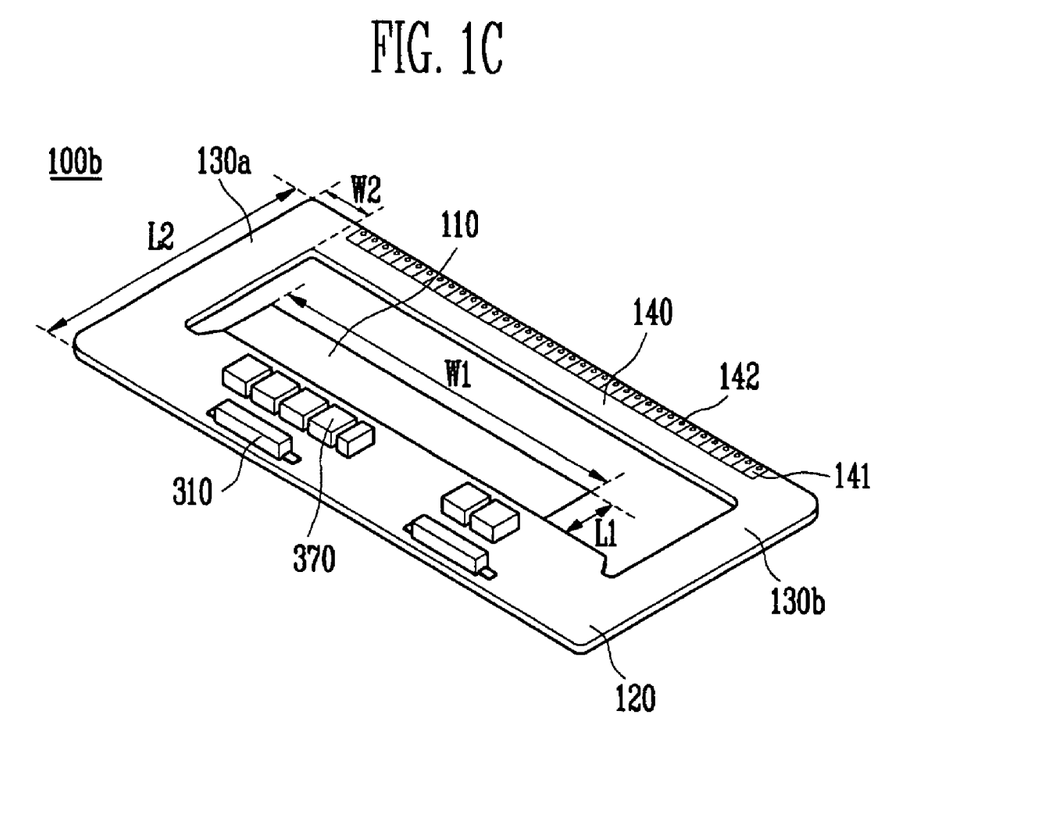
FIG. 1C illustrates a perspective view of a flexible printed circuit board according to another embodiment of the present invention.

According to another exemplary embodiment of the present invention, a flexible printed circuit board may include more than one connection substrate portions. For example, as illustrated in FIG. 1C, a flexible printed circuit board 100b may be similar to the flexible printed circuit board 100a, with the exception of having a first connection substrate portion 130a and a second connection substrate portion 130b.

The first connection substrate portion 130a may be similar to the connection substrate portion 130 described previously with respect to FIGS. 1A-1B. The second connection substrate portion 130b may be similar to the first connection substrate portion 130a and positioned opposite thereto. The first connection substrate portion 130a may be coupled between a first end of the second substrate portion 120 and a first end of the third substrate portion 140, and a second connection substrate portion 130b may be coupled between a second end of the second substrate portion 120 and a second end of the third substrate portion 140. In other words, the second and third substrate portions 120 and 140 may be connected to the first connection substrate portion 130a at one side and to the second connection substrate portion 130b at another side to form a rectangular frame.

When a flexible printed circuit board includes more than one connection substrate portion, e.g., first and second connection substrate portions 130a and 130b, the conductive wiring layer may pass through each of the connection substrate portions. For example, half of the conductive wiring layer may be formed in the first connection substrate portion 130a and another half of the conductive wiring layer may be formed in the second connection substrate portion 130b. Each of the first and second connection substrate portions 130a and 130b may include one conductive wiring layer and have a width, length, and thickness as described previously with respect to the connection substrate portion 130 of the flexible printed circuit board 100a.

Figure 2:
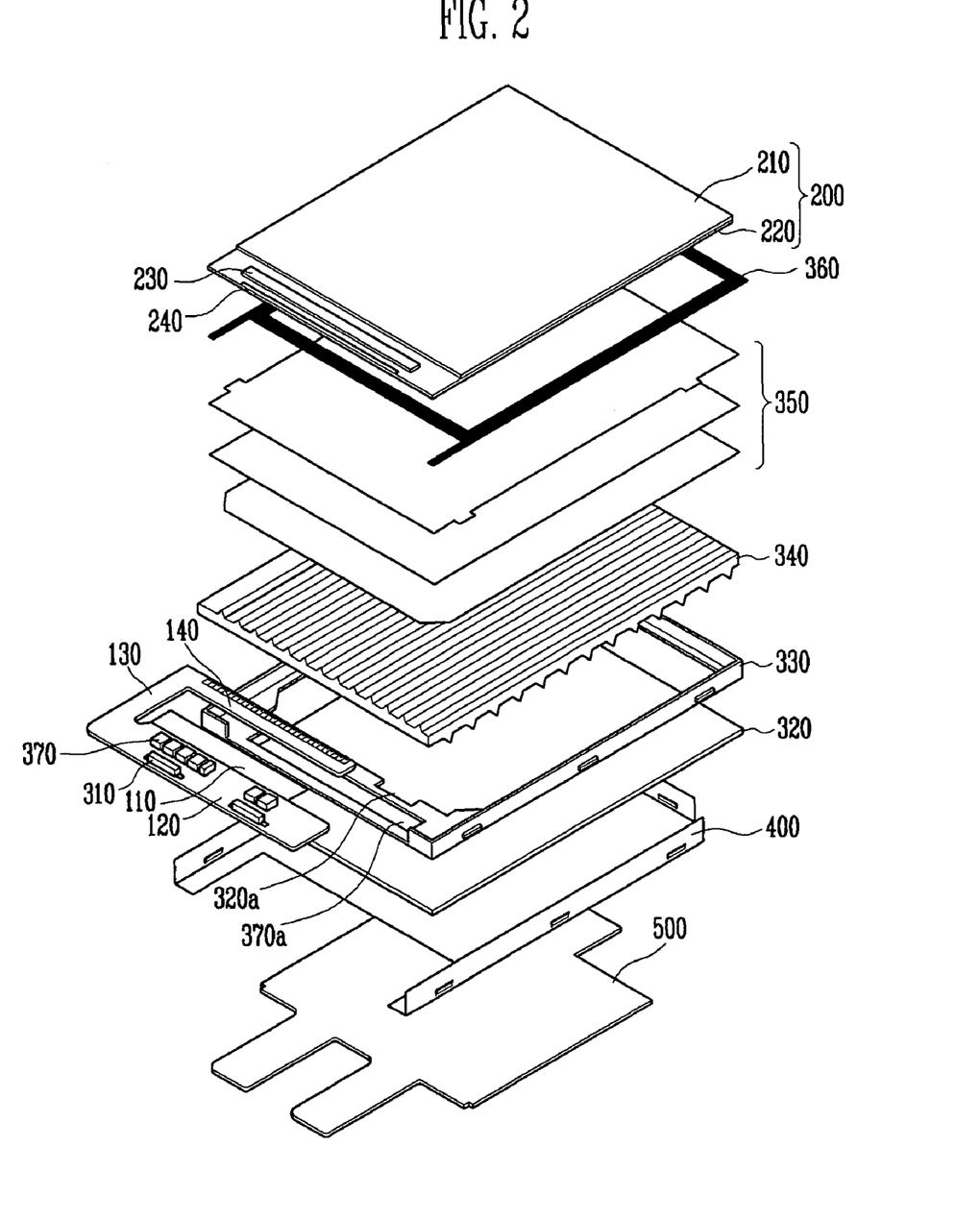
FIG. 2 illustrates an exploded perspective view of a liquid crystal display device having a flexible printed circuit board device according to an embodiment of the present invention.
Figure 3:
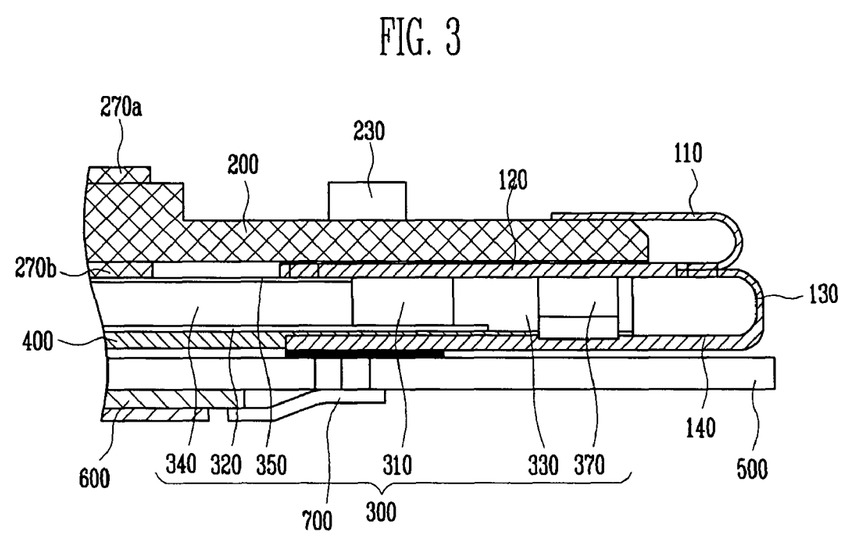
FIG. 3 illustrates a cross-sectional view of a liquid crystal display device having a flexible printed circuit board according to an embodiment of the present invention.

According to yet another exemplary embodiment of the present invention, a flexible printed circuit board, e.g., the flexible printed circuit board 100a or the flexible printed circuit board 100b, may be incorporated into, e.g., a liquid crystal display device. For example, as illustrated in FIGS. 2-3, a liquid crystal display device may include a liquid crystal display panel 200, a backlight unit 300, a printed circuit board 500 and the flexible printed circuit board 100a.

The liquid crystal display panel 200 may include a first panel 210, a second panel 220, and a liquid crystal (not shown) injected therebetween. The liquid crystal display panel 200 may further include first and second polarizing plates 270a and 270b on each external surface of the first and second panels 210 and 220, respectively.

The second panel 220 of the liquid crystal display panel 200 may include a plurality of thin film transistors (TFTs) arranged in a matrix form (not shown), an integrated circuit 230 on an upper surface of the second panel 220, and a pad portion 240. Each TFT may have a source electrode connected to a data line, a gate electrode connected to a scan line, and a drain electrode connected to a pixel electrode. Accordingly, when scan signals are supplied to the scan line, the TFT may be turned on to transfer data signals from the data line to the pixel electrode. Data and scan signals may be supplied by the integrated circuit 230 and received by the pad portion 240.

The first panel 210 of the liquid crystal display panel 200 may be parallel to the second panel 220, and may include a common electrode made of indium-tin-oxide (ITO). A predetermined voltage may be applied to the common electrode to form an electric field between the common electrode and the pixel electrode. Accordingly, an angle of the liquid crystal injected between the first and second panels 210 and 220 may be modified by the electric field to alter light transmittance therethrough in order to display images.

The backlight unit 300 of the liquid crystal display device according to an embodiment of the present invention may provide light with a predetermined brightness with respect to signals received from the printed circuit board 100a. The backlight unit 300 may include a light source, e.g., at least one light emitting diode 310, mounted on the flexible printed circuit board 100a, a reflective sheet 320, a mold frame 330, a light guide plate 340, an optical sheet 350, and a rim frame 360.

The light emitting diodes 310 may generate light in response to driving signals transferred to the second substrate portion 120 of the flexible printed circuit board 100a. The light guide plate 340 may transfer the light generated by the light emitting diodes 310 to the liquid crystal display panel 200. The reflective sheet 320 may be positioned below the light guide plate 340 to capture light leaking from the light guide plate 340 and improve light efficiency thereof. The optical sheets 350 may improve brightness of the light supplied from the light guide plate 340 to the liquid crystal display panel 200. The mold frame 330 may include a first groove 320A and a second groove 370a, so that the light emitting diodes 310 and the boosting circuit 370 positioned on the second substrate portion 120 of the flexible printed circuit board 100a may be inserted therein. The rim frame 360 may be formed to correspond to a lower part of a pixel region within the mold frame 330 for support thereof.

The printed circuit board 500 of the liquid crystal display device according to an embodiment of the present invention may apply signals to the liquid crystal display panel 200 and the backlight unit 300 through the flexible printed circuit board 100a in response to control signals received from an external source. A bezel 400 may be positioned between the printed circuit board 500 and the backlight unit 300 for support of the liquid crystal display panel 200. The bezel 400 may be manufactured with metal.

The flexible printed circuit board 100a of the liquid crystal display device according to an embodiment of the present invention may transfer electrical signals of the printed circuit board 500 to the backlight unit 300 and the liquid crystal display panel 200. The flexible printed circuit board 100a may include the first substrate portion 110, the second substrate portion 120, the connection substrate portion 130 and the third substrate portion 140 as was previously described with respect to FIGS. 1A-1B.

More specifically, the first substrate portion 110 of the flexible printed circuit board 100a may be connected to the liquid crystal display panel 200, as illustrated in FIG. 3, so that at least one terminal 111 of the first substrate portion 110 may be in electrical communication with the pad portion 240 of the liquid crystal display panel 200 (not shown in FIG. 3). The second substrate portion 120 of the flexible printed circuit board 100a may be in communication with a bottom surface of the liquid crystal display panel 200, i.e., a non-pixel region of the liquid crystal display panel 200, and may include at least one light emitting diode 310 thereon. The second substrate portion 120 may further include a boosting circuit 370 for boosting a voltage applied to the liquid crystal display panel 200 from the printed circuit board 500.

The connection substrate portion 130 may bend away from the first substrate portion 110 toward the printed circuit board 500, so that the third substrate portion 140 may be connected to the printed circuit board 500 via the terminal 141 by soldering.

According to still another exemplary embodiment of the present invention, a process of assembling the flexible printed circuit board 100a according to the present invention will be described in more detail below with respect to FIGS. 4A-4D. In this respect, it should be noted that the assembly process illustrated in FIGS. 4A-4D and the corresponding text are intended to provide an exemplary embodiment of an assembly process of the flexible printed circuit board 100a, and are not intended to limit in any way the assembly process of the liquid crystal display device.

Figure 4A:
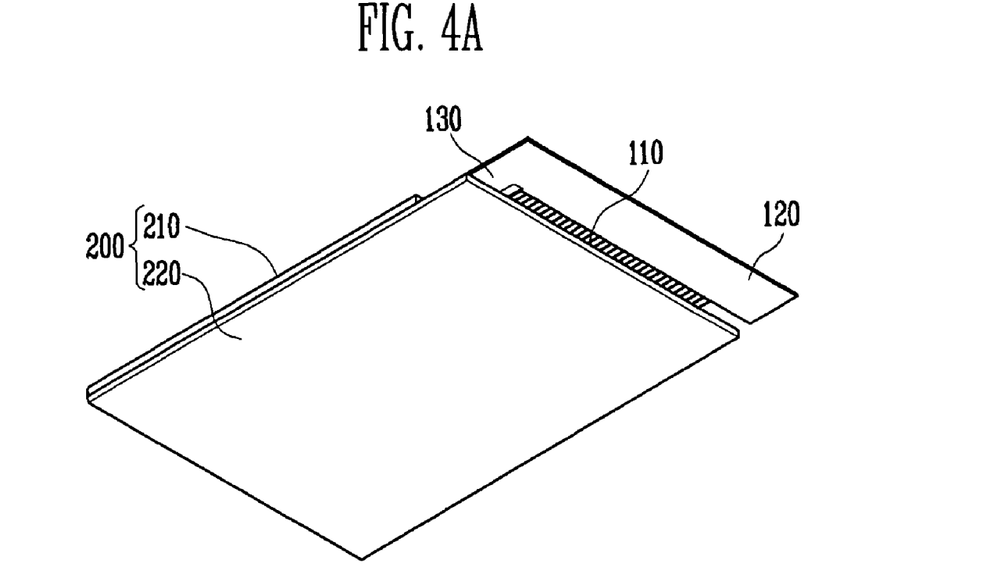
FIGS. 4A-4D illustrate perspective views of sequential steps in an assembly process of a flexible printed circuit board of a liquid crystal display device according to an embodiment of the present invention.

First, as illustrated in FIG. 4A, the terminal 111 of the first substrate portion 110 of the flexible printed circuit board 100a may be connected to the pad portion 240 of the liquid crystal display panel 200. More specifically, a lower surface of the first substrate portion 110 may be positioned on an upper surface of the second panel 220 of the liquid crystal display panel 200, so that the first and third substrate portions 110 and 140 are in communication with the upper surface of the second panel 220 and the second substrate portion 120 is projected away from the liquid crystal display panel 200.

Figure 4B:
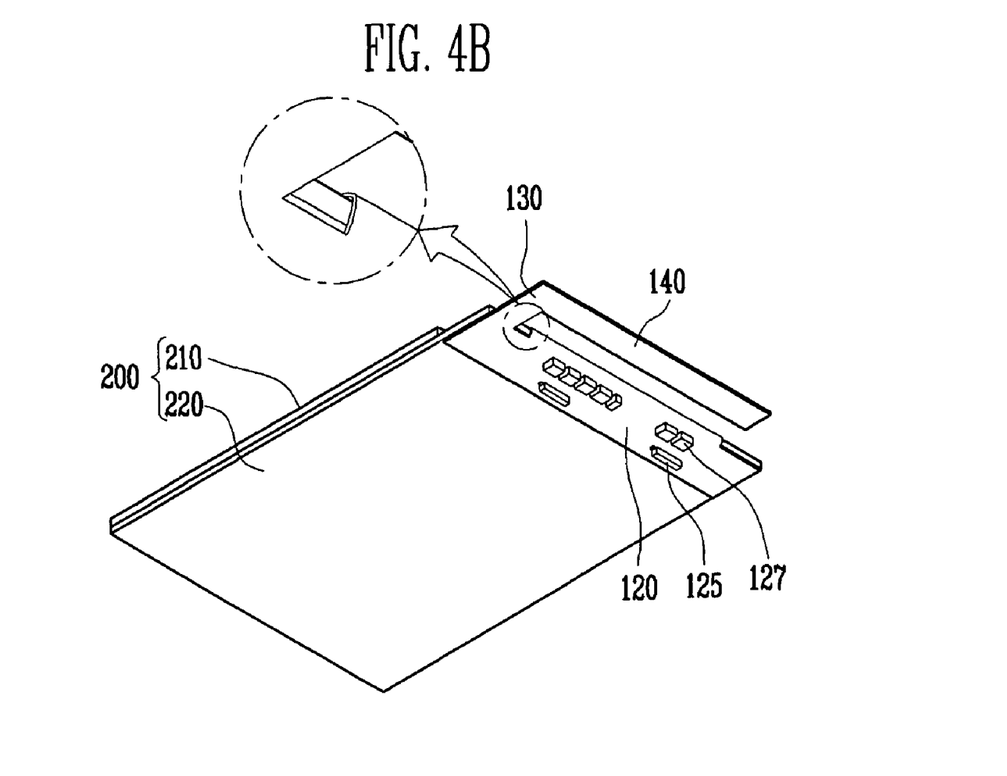

Next, the flexible printed circuit board 100a may be bent over an edge of the liquid crystal display panel 200, so the second substrate portion 120 may be in communication with the lower surface of the liquid crystal display panel 200. In other words, the first substrate portion 110 may be bent, as illustrated in FIG. 4B, so that a segment of the flexible printed circuit board 100a including the at least one terminal 111 of the first substrate portion 110 may be in communication with the upper surface of the liquid crystal display panel 200, while another segment of the flexible printed circuit board 100a including the second substrate portion 120 may be in communication with the lower surface of the liquid crystal display panel 200. It should be noted that bending of the flexible printed circuit board 100a may position the second substrate portion 120 between the second panel 220 and the diodes 310. Bending of the first substrate portion 110 may cause rotation of the third substrate portion 140, so that the third substrate portion 140 may project away from the liquid crystal display panel 200.

Figure 4C:
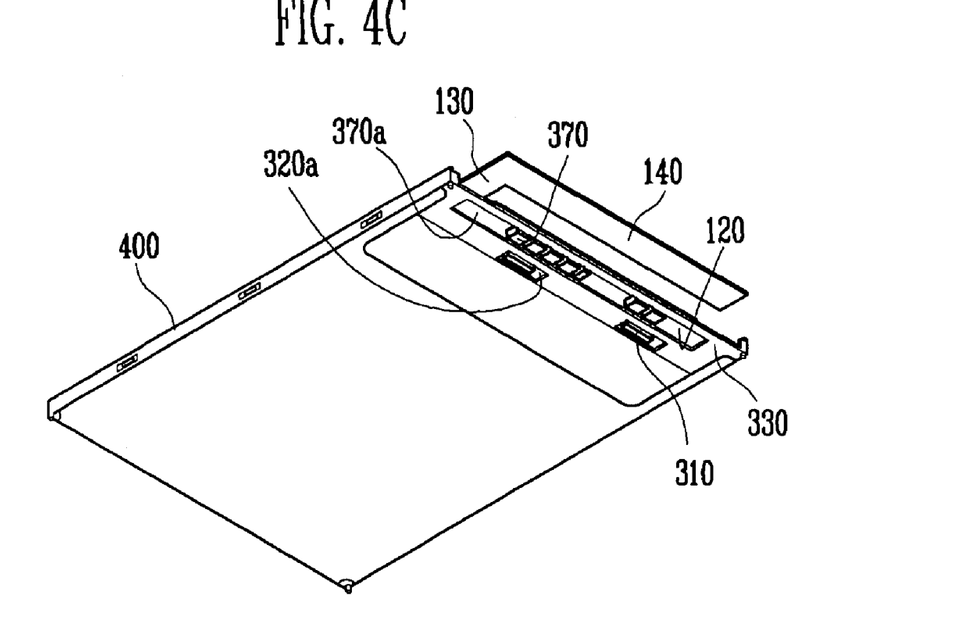

Subsequently, as illustrated in FIG. 4C, the backlight unit 300 and the bezel 400 may be connected to the second panel 220 of the of the liquid crystal display panel 200, so that the second substrate portion 120 may be positioned between the liquid crystal display panel 200 and the backlight unit 300. It should be noted that attachment of the backlight unit 300 to the liquid crystal display panel 200 may include inserting the at least one light emitting diode 310 and boosting circuit component 370 of the second substrate portion 120 through the first and second grooves 320a and 370a, respectively, of the mold frame 330.

Figure 4D:
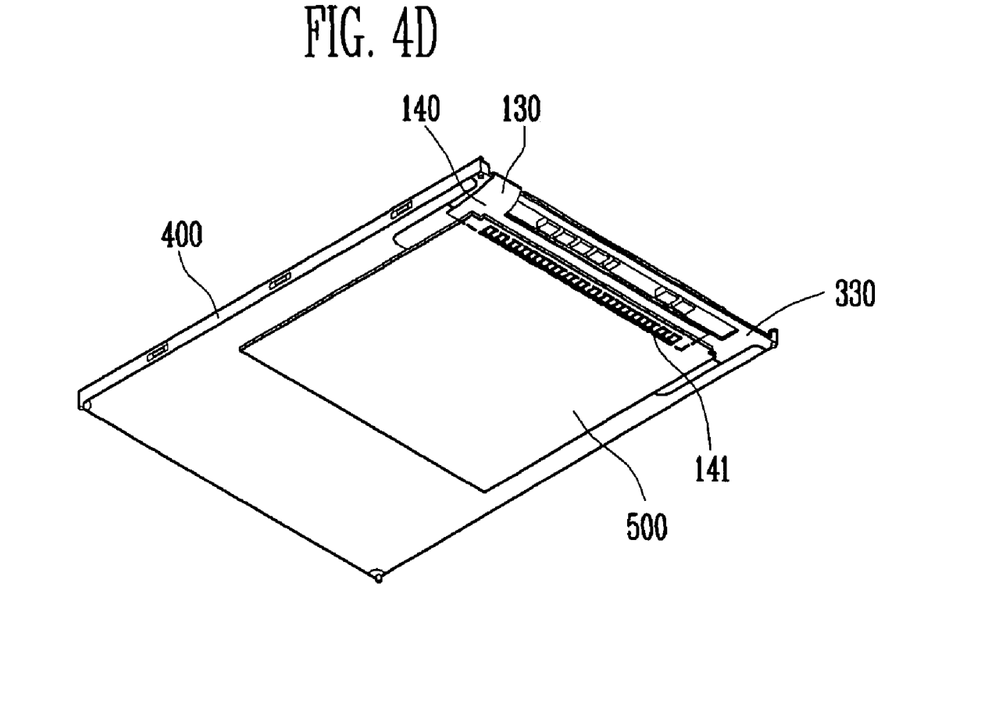

Next, the printed circuit board 500 may be soldered to the terminal 141 of the third substrate portion 140, and the connection substrate portion 130 may be bent so that the third substrate portion 140 and the printed circuit board 500 may be positioned on a bottom surface of the backlight unit 300, as illustrated in FIG. 4D. In this respect, it should be noted that soldering of the printed circuit board 500 and the third substrate portion 140 prior to bending the connection substrate portion 130 may minimize heat transfer to the second substrate portion 120 upon contact between the second and third substrate portions 120 and 140. Accordingly, bending of the second substrate portion 120 due to excess heat may be minimized or even prevented. Further, accurate control of the second substrate portion 120 positioning, i.e., no position variation due to bending, may facilitate specific predetermined positioning of the at least one light emitting diode 130 on the second substrate portion 120 and, thereby, provide uniform brightness.

The flexible printed circuit board according to an embodiment of the present invention may be advantageous in connecting and providing efficient electrical communication between a plurality, i.e., at least three, of vertically stacked units. Further, while providing electrical connection, the flexible printed circuit board according to an embodiment of the present invention may simultaneously provide a convenient supporting substrate for positioning circuit devices, i.e., driving components, within a single flexible printed circuit board. It should further be noted that as compared to conventional flexible printed circuit boards, the flexible printed circuit board according to an embodiment of the present invention may employ a reduced number of materials, thereby decreasing manufacturing costs.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims. For example, the pattern design of the conductive wiring layer in the flexible printed circuit board, the thickness and width of each part of the flexible printed circuit board, the type of display device, the configuration of elements within the display device, and so forth, may be modified and adjusted without departing from the scope of the invention.

What is claimed is:

1. A flexible printed circuit board, comprising:
   a first substrate portion having at least one first terminal;
   a second substrate portion in communication with the first substrate portion and having at least one circuit device;
   a connection substrate portion in communication with the second substrate portion, the connection substrate portion extending away from the second substrate portion in a same direction as the first substrate portion extending away from the second substrate portion; and
   a third substrate portion in communication with the connection substrate portion, the third substrate portion having at least one second terminal, wherein the connection substrate portion is coupled between the second substrate portion and the third substrate portion, the connection substrate portion bent away from the first substrate portion.

2. The flexible printed circuit board as claimed in claim 1, wherein a length of the first substrate portion is shorter than a length of the connection substrate portion.

3. The flexible printed circuit board as claimed in claim 1, wherein a width of the first substrate portion is larger than a width of the connection substrate portion.

4. The flexible printed circuit board as claimed in claim 1, wherein the first substrate portion is thinner than the second substrate portion.

5. The flexible printed circuit board as claimed in claim 4, wherein the first substrate portion includes one conductive wiring layer, and the second substrate portion includes a plurality of conductive wiring layers.

6. The flexible printed circuit board as claimed in claim 1, wherein the connection substrate portion is thinner than the third substrate portion.

7. The flexible printed circuit board as claimed in claim 6, wherein the connection substrate portion includes one conductive wiring layer, and the third substrate portion includes a plurality of conductive wiring layers.

8. The flexible printed circuit board as claimed in claim 1, wherein the connection substrate portion includes a first connection substrate portion coupled between a first end of the second substrate portion and a first end of the third substrate portion, and a second connection substrate portion coupled between a second end of the second substrate portion and a second end of the third substrate portion.

9. The flexible printed circuit board as claimed in claim 8, wherein the first end of the second substrate portion and the first end of the third substrate portion are adjacent to one another along a direction parallel to the first connection substrate portion.

10. A display device, comprising:
a display panel;
a backlight unit adjacent to the display panel;
a printed circuit board; and
a flexible printed circuit board including,
 a first substrate portion in communication with the display panel and bent around an edge thereof,
 a second substrate portion in communication with the first substrate portion and positioned between the display panel and the backlight unit,
 a connection substrate portion in communication with the second substrate portion and bent around an edge of the backlight unit,
 the connection substrate portion extending away from the second substrate portion in a same direction as the first substrate extending from the second substrate; and
 a third substrate portion in communication with the connection substrate portion and the printed circuit board, wherein the connection substrate portion is coupled between the second substrate portion and the third substrate portion, the connection substrate portion bent away from the first substrate portion.

11. The display device as claimed in claim 10, wherein a width of the first substrate portion is greater than a width of the connection substrate portion.

12. The display device as claimed in claim 10, wherein a length of the first substrate portion is shorter than a length of the connection substrate portion.

13. The display device as claimed in claim 10, wherein each of the first substrate portion and the connection substrate portion are thinner than each of the second and third substrate portions.

14. The display device as claimed in claim 13, wherein each of the first substrate portion and the connection substrate portion includes one conductive wiring layer, and each of the second and third substrate portions includes a plurality of conductive wiring layers.

15. The display device as claimed in claim 10, wherein the connection substrate portion includes first and second connection substrate portions, each of the first and second connection substrate portions is coupled between the second and third substrate portions and positioned in parallel to one another.

16. The display device as claimed in claim 10, wherein at least one light source is on the second substrate portion.

17. The display device as claimed in claim 16, wherein the at least one light source is a light emitting diode.

18. The display device as claimed in claim 10, wherein the connection substrate portion is thinner than the third substrate portion.

* * * * *